(12) United States Patent
Nishizawa et al.

(10) Patent No.: US 7,875,549 B2
(45) Date of Patent: Jan. 25, 2011

(54) FLUORINE DOPED CARBON FILMS PRODUCED BY MODIFICATION BY RADICALS

(75) Inventors: Kenichi Nishizawa, Nirasaki (JP); Yasuhiro Terai, Nirasaki (JP); Akira Asano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 832 days.

(21) Appl. No.: 10/567,733

(22) PCT Filed: Jul. 23, 2004

(86) PCT No.: PCT/JP2004/010484

§ 371 (c)(1),
(2), (4) Date: Feb. 10, 2006

(87) PCT Pub. No.: WO2005/017990

PCT Pub. Date: Feb. 24, 2005

(65) Prior Publication Data

US 2006/0223306 A1   Oct. 5, 2006

(30) Foreign Application Priority Data

Aug. 15, 2003   (JP) .............................. 2003-293904

(51) Int. Cl.
*H01L 21/4763* (2006.01)
*H01L 21/31* (2006.01)
*H01L 21/00* (2006.01)

(52) U.S. Cl. ..................... 438/623; 438/780; 438/798; 257/E23.167

(58) Field of Classification Search ................. 438/623, 438/780, 798; 257/E23.167
See application file for complete search history.

(56) References Cited

U.S. PATENT DOCUMENTS

| | | | | |
|---|---|---|---|---|
| 5,989,998 A * | 11/1999 | Sugahara et al. | ............ | 438/623 |
| 6,107,192 A * | 8/2000 | Subrahmanyan et al. | .... | 438/637 |
| 6,764,939 B1 * | 7/2004 | Yoshitaka | .................... | 438/624 |
| 2001/0042513 A1* | 11/2001 | Kao et al. | ............ | 118/723 MR |
| 2002/0046808 A1* | 4/2002 | Hongo et al. | .......... | 156/345.41 |
| 2003/0025209 A1* | 2/2003 | Jiwari et al. | ................ | 257/774 |
| 2003/0084587 A1* | 5/2003 | Kumar et al. | ................ | 34/218 |
| 2003/0116854 A1* | 6/2003 | Ito et al. | ..................... | 257/761 |
| 2004/0161946 A1* | 8/2004 | Tsai et al. | ................... | 438/778 |

FOREIGN PATENT DOCUMENTS

| | | |
|---|---|---|
| EP | 1 035 568 A1 | 9/2000 |
| EP | 1 077 486 A1 | 2/2001 |
| EP | 1 077 846 A1 | 2/2001 |
| JP | 08-083842 | 3/1996 |
| JP | 10-144675 | 5/1996 |

(Continued)

*Primary Examiner*—Hsien-ming Lee
*Assistant Examiner*—Kevin Parendo
(74) *Attorney, Agent, or Firm*—Oblon, Spivak, McClelland, Maier & Neustadt, L.L.P.

(57) ABSTRACT

A film forming method includes the steps of forming a F-doped carbon film by using a source gas containing C and F, and modifying the F-doped carbon film by radicals, the source gas having a F/C ratio larger than 1 smaller than 2, the F/C ratio being defined as a ratio of a number of F atoms to a number of C atoms in a source gas molecule.

13 Claims, 9 Drawing Sheets

FOREIGN PATENT DOCUMENTS

| | | |
|---|---|---|
| JP | 9-237783 | 9/1997 |
| JP | 10-144676 | 5/1998 |
| JP | 11-154672 | 6/1999 |
| JP | 11-330075 | 11/1999 |
| JP | 2001-135631 | 5/2001 |
| JP | 2002-299314 | 10/2002 |
| JP | 2002-329682 | 11/2002 |

* cited by examiner

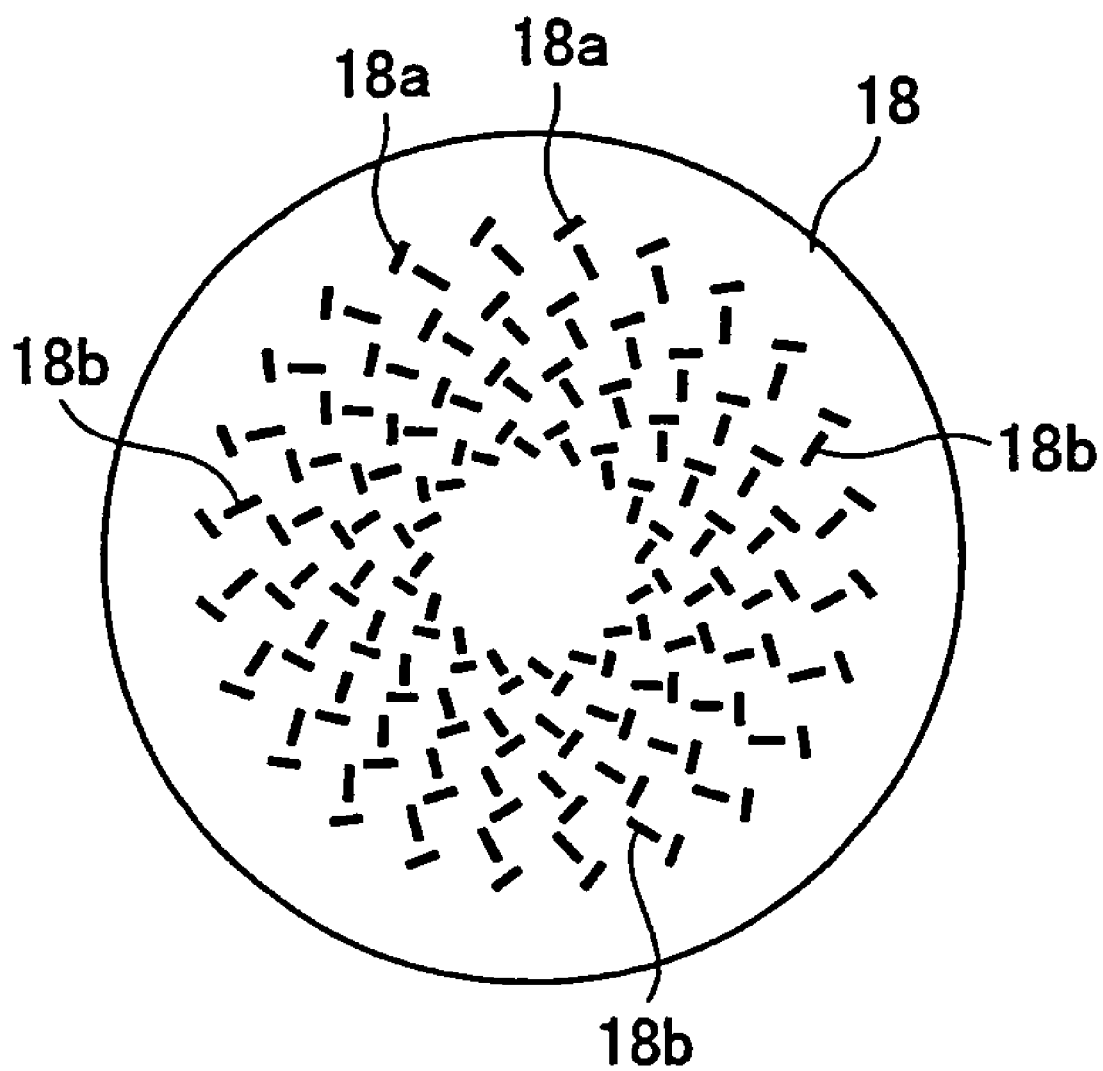

FLUORINE DOPED CARBON FILMS PRODUCED BY MODIFICATION BY RADICALS

TECHNICAL FIELD

The present invention generally relates to method of forming insulation films and more particularly to a film forming method of a F (fluorine)-doped carbon film, fabrication method of a semiconductor device that uses such a film formation method of fluorine-doped carbon film, a semiconductor device formed with such a method, and a substrate processing system for fabricating such a semiconductor device.

BACKGROUND ART

In recent miniaturized semiconductor devices, so-called multilayer interconnection structure is used for electrically interconnecting a vast number of semiconductor elements formed on a substrate. In a multilayer interconnection structure, a large number of interlayer insulation films, each burying therein an interconnection pattern, are laminated, and an interconnection pattern of one layer is connected to an interconnection pattern of an adjacent layer or a diffusion region in the substrate via a contact hole formed in the interlayer insulation film.

With such miniaturized semiconductor devices, complex interconnection patterns are formed in the interlayer insulation film in close proximity, and delay of electric signals caused by the parasitic capacitance of the interlayer insulation film becomes a serious problem.

Thus, with the ultra-miniaturized semiconductor devices of these days called submicron devices or sub-quarter micron devices, a copper interconnection pattern is used as the interconnection layer constituting the multilayer interconnection structure, and a F-doped silicon oxide film (SiOF film) having a specific dielectric constant of 3-3.5 is used for the interlayer insulation film in place of conventional silicon oxide film ($SiO_2$ film) having the specific dielectric constant of about 4.

However, there is a limit in the effort of reducing the specific dielectric constant as long as an SiOF film is used. With such an insulation film based on $SiO_2$, it has been difficult to achieve the specific dielectric constant of less than 3.0 as is required by the semiconductor devices of the generation characterized by the design rule of 0.1 µm or later.

Meanwhile there are various materials called low dielectric (low-K) insulation film having a low specific dielectric constant. On the other hand, an interlayer insulation film used for the multilayer interconnection structure is required not only to have a low specific dielectric constant but also high mechanical strength and high stability against thermal anneal processing.

A F-doped carbon (CF) film is a promising material for the low dielectric constant insulation film for use in ultra fast semiconductor devices of the next generation in view of its sufficient mechanical strength and its capability of achieving low specific dielectric constant of 2.5 or less.

Generally, a F-doped carbon film has a chemical formula represented by $C_nF_m$. It is reported that such an F-doped carbon film can be formed by a parallel-plate type plasma processing apparatus or an ECR type plasma processing apparatus.

For example, Patent Reference 1 obtains a F-doped carbon film by using a fluorocarbon compound such as $CF_4$, $C_2F_6$, $C_3F_8$, $C_4F_8$, or the like, in a parallel-plate type plasma processing apparatus as a source gas. Further, Patent Reference 2 obtains a F-doped carbon film by using a fluorinated gas such as $CF_4$, $C_2F_6$, $C_3F_8$, $C_4F_8$, or the like, in an ECR-type plasma processing apparatus.

Patent Reference 1
  Japanese Laid-Open Patent Application 8-83842

Patent Reference 2
  Japanese Laid-Open Patent Application 10-144675

DISCLOSURE OF THE INVENTION PROBLEMS TO BE SOLVED BY THE INVENTION

In conventional F-doped carbon films, there has been a problem of large leakage current. Further, there occurs degassing from the film when a conventional F-doped carbon films is heated to a temperature of about 400° C., which is used in semiconductor process. Thus, the use of such a film for the interlayer insulation film raises a serious problem of reliability for the semiconductor device. Such large leakage current and occurrence of degassing indicate that conventional F-doped carbon films contain various defects therein.

Further, when attempt is made to form such a F-doped carbon film by using the conventional art, there is a need of adding a hydrogen gas to the source gas in order to remove the F radicals formed as a result of dissociation of the fluorocarbon compounds, while addition of such hydrogen gas leads to the situation that the fluorine-doped carbon film thus obtained contains a large amount of hydrogen therein. In such a fluorine-doped carbon film containing large amount of hydrogen, however, there occurs release of HF in the film, while this leads to the problem of corrosion in the interconnection layer or in the insulation film.

Further, as noted before, an F-doped carbon film is used frequently in a multilayer interconnection structure as an interlayer insulation film in combination with copper interconnection patterns. With such a multilayer interconnection structure that uses a copper interconnection pattern, it is essential to cover the sidewall surfaces of the interconnection grooves or via-holes, in which the interconnection patterns are formed, by a barrier metal film typically of Ta, or the like, in order to block the diffusion of Cu from the interconnection patterns. When a Ta barrier metal film is deposited on the surface of the F-doped carbon film, however, there occurs a reaction between F in the F-doped carbon film and Ta in the barrier metal film and there is formed a volatile compound of TaF. It should be noted that such formation of TaF occurs particularly on the sidewall surface of the via-holes where the F-doped carbon film is exposed, while formation of TaF causes degradation in the adherence and deteriorates the reliability or lifetime of the multilayer interconnection structure.

FIG. 1 shows an example of the via-contact structure that uses such a conventional F-doped carbon film.

Referring to FIG. 1, there is formed an interlayer insulation film 2 of an F-doped carbon film on a low-K dielectric interlayer insulation film 1 in which a copper interconnection pattern 1A is embedded, wherein there is formed a via-hole 2A in the F-doped carbon film 2 so as to expose the copper interconnection pattern 1A while using a hard mask pattern 3 formed on the F-doped carbon film 2 as a mask.

On the sidewall surface of the via-hole 2A, there is exposed the F-doped carbon film constituting the interlayer insulation film 2, wherein the foregoing sidewall surface is covered with a Ta film 4 deposited on the hard mask pattern 3 so as to cover the via-hole 2A. With such a contact structure, a large amount of hydrogen is contained in the film as explained before, and there is a concern that F constituting the film causes a reaction with the hydrogen to form HF of corrosive nature.

Further, at the sidewall surface of the via-hole 2A in which the Ta barrier film 4 makes a contact with the fresh surface of the F-doped carbon film exposed by the dry etching process, there is formed a volatile TaF as a result of the reaction with F existing on such film surface.

Thus, it is the general object of the present invention to provide a novel and useful film forming method, fabrication method of a semiconductor device, semiconductor device and substrate processing system, wherein the foregoing problems are eliminated.

A more specific object of the present invention is to provide a film forming method capable of forming highly reliable multilayer interconnection structure while using a F-doped carbon film for the interlayer insulation film.

According to the present invention, there is provided a film forming method, comprising the steps of:

forming a F-doped carbon film by using a source gas containing C and F; and modifying said F-doped carbon film by radicals, said source gas having a F/C ratio, defined as a ratio of a number of F atoms to a number of C atoms in said source gas molecule, wherein said F/C ratio is larger than 1 but smaller than 2.

Further, according to the present invention, there is provided a method of fabricating a semiconductor device, comprising the steps of:

depositing a F-doped carbon film on a substrate by a plasma CVD process that uses a source gas that contains C and F in a molecule thereof;

forming an opening in said F-doped carbon film by a dry etching process of said F-doped carbon film; and covering a sidewall surface and a bottom surface of said opening by a metal film, wherein there is provided, after said step of forming said opening but before said step of covering said sidewall surface and bottom surface of said opening by said metal film, a step of modifying at least said sidewall surface of said opening by radicals, said source gas having a CF ratio, defined as a ratio of a number of F atoms to a number of C atoms in said source gas molecule, wherein said F/C ratio is larger than 1 but smaller than 2.

In another aspect, there is provided a substrate processing system, comprising:

a vacuum transfer chamber;

a first processing chamber coupled to said vacuum transfer chamber for conducing a dry etching of a fluorine-doped carbon film;

a second processing chamber coupled to said vacuum transfer chamber for modifying a fluorine-doped carbon film;

a third processing chamber coupled to said vacuum transfer chamber for conducting dry cleaning of a fluorine-doped carbon film; and a fourth processing chamber coupled to said vacuum transfer chamber for conducting deposition of a metal film, wherein each of said first and second processing chambers comprises:

a processing vessel coupled to an evacuation system and having a stage for holding a substrate to be processed;

a microwave window provided so as to face said substrate to be processed on said stage and constituting a part of an outer wall of said processing vessel;

a planar microwave antenna provided outside said processing vessel in coupling to said microwave window;

a first gas supply system for supplying a noble gas to an interior of said processing vessel; and a second gas supply system provided in said processing vessel so as to divide a space inside said processing vessel into a first space part in which said microwave window is included and a second space part in which said stage is included, said second gas supply system being formed with an opening enabling invasion of plasma formed in said first space part into said second space part.

In a further aspect, there is provided a method of fabricating a semiconductor device, comprising the steps of:

depositing a fluorine-doped carbon film on a substrate by a plasma CVD process that uses a source gas that contains C and F in a molecule thereof;

forming an opening in said fluorine-doped carbon film by a dry etching process; and depositing a first metal film so as to cover a sidewall surface and a bottom surface of said opening, wherein there is provided, after said step of forming said opening but before said step of depositing said first metal film, a step of depositing a second metal film that forms a stable compound when reacted with F, such that said second metal film covers at least said sidewall surface and bottom surface of said opening.

In a further aspect, there is provided a semiconductor device, comprising:

a substrate;

a fluorine-doped carbon film formed over said substrate;

an opening formed in said fluorine-doped carbon film;

a first metal film formed so as to cover at least a sidewall surface and a bottom surface of said opening, wherein there is formed, between said fluorine-doped carbon film and said first metal film, a second metal film so as to cover said sidewall surface and bottom surface of said opening, there being formed a fluoride film in said second metal film along an interface to said sidewall of said opening where said fluorine-doped carbon film is exposed.

By modifying an exposed surface of a F-doped carbon film, F atoms existing on the film surface are removed according to the present invention, and it becomes possible to suppress formation of volatile fluoride film at the interface, even in the case a barrier metal film, or the like, is formed oh such a film surface. Thereby, it becomes possible to realize a reliable electric contact. By using a plasma CVD process that uses a microwave and characterized by low electron temperature at the time of formation of the F-doped carbon film, and further by using a source gas having an F/C ratio, defined as a ratio of F to C in the molecule, larger than 1 but less than 2, it becomes possible to achieve deposition of the desired F-doped carbon film without adding a hydrogen gas. Because the F-doped carbon film thus formed does not contain hydrogen substantially in the film, and there occurs no problem of causing corrosion in the interconnection layer or other insulation layer when used for a multilayer interconnection structure. Further, because the F-doped carbon film of the present invention is substantially free from hydrogen, the film does not undergo etching when the foregoing modification processing is conducted by using nitrogen radicals. Thereby, it becomes possible to conduct the desired modification processing stably and with good reproducibility.

Further, according to the present invention, it becomes possible, by way of conducting the dry etching process of the F-doped carbon film and the dry cleaning process and further the metal film deposition process by using a cluster-type substrate processing system, to conduct the process from the dry etching process to the metal film deposition process without exposing the substrate to the air, and it becomes possible to avoid absorption of water in the air to the highly reactive exposed surface of the F-doped carbon film immediately after the dry etching process.

Further, according to the present invention, it becomes possible, at the time of depositing a metal film such as a Ta film on a F-doped carbon film, to avoid the problem of formation of volatile compound such as TaF and the interface between the interlayer insulation film and the barrier metal film becoming unstable, by interposing a second metal film that forms a stable with the reaction with F.

BRIEF DESCRIPTION OF THE DRAWINGS

FIG. 2B is another diagram showing the construction of a microwave plasma processing apparatus used with the present invention. microwave plasma processing apparatus of FIG. 2.

BEST MODE FOR IMPLEMENTING THE INVENTION

First Embodiment

Figure 1:
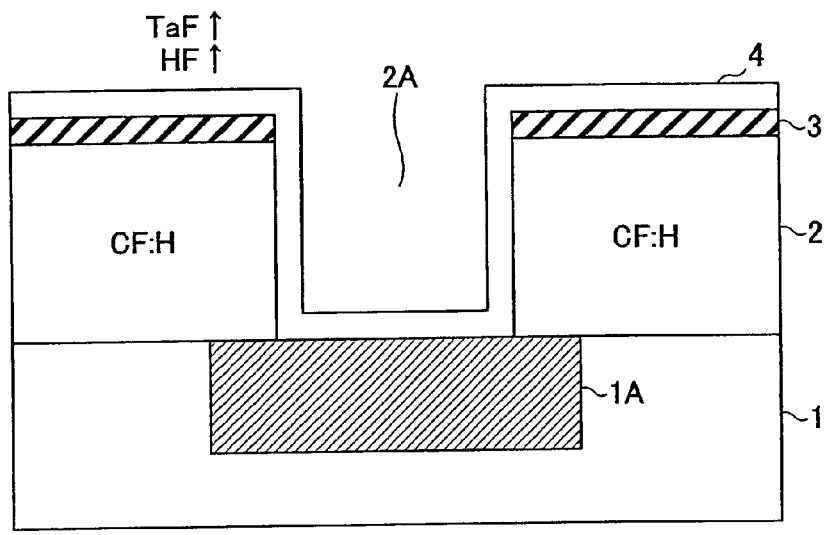
FIG. 1 is a diagram explaining the problem with a conventional fabrication process of a semiconductor device.
Figure 2A:
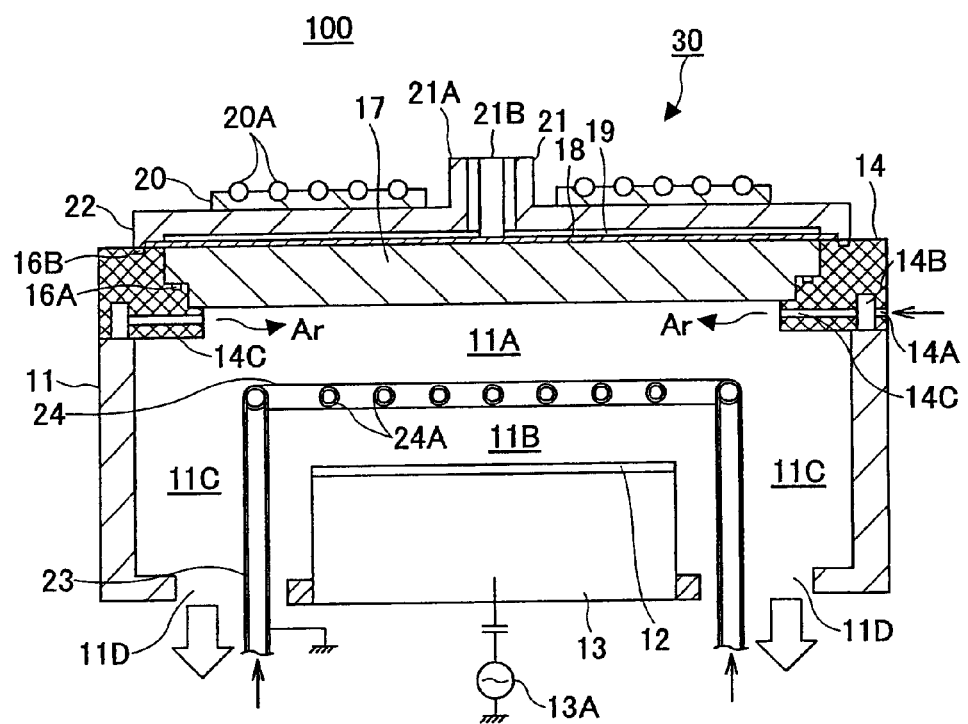
FIG. 2A is a diagram showing the construction of a microwave plasma processing apparatus used with the present invention.

FIGS. 2A and 2B are diagrams showing the construction of a microwave plasma processing apparatus 100 used with the first embodiment of the present invention, wherein FIG. 2A shows the microwave plasma processing apparatus in a cross-sectional view, while FIG. 2B shows the construction of a radial line slot antenna.

Referring to FIG. 2A, the microwave plasma processing apparatus 100 includes a processing vessel 11 evacuated from plural evacuation ports 11D and a stage 13 is provided in the processing vessel 11 of holding a substrate 12 to be processed. In order to achieve uniform evacuation of the processing vessel 11, there is formed a ring-shaped space 11C around the stage 13. Further, the plural evacuation ports 11D are formed in communication with the space 11C with a uniform interval, and hence in axial symmetry to the substrate to be processed. Thereby, it becomes possible to evacuate the processing vessel 11 uniformly via the space 11C and the evacuation ports 11D.

On the processing vessel 11, there is provided a ceramic cover plate of low-loss dielectric in the location corresponding to the substrate 12 held on the stage 13 for processing, via a seal ring 16A as a part of the outer wall of the processing vessel 11, such that the ceramic cover plate 17 faces the substrate 12 to be processed.

The cover plate 17 is seated upon a ring-shaped member provided on the processing vessel via the foregoing seal ring 16A, while the ring-shaped member 14 is provided with a ring-shaped plasma gas passage 14B corresponding to the ring-shaped member 14 in communication with a plasma gas supply port 14A. Further, the ring-shaped member 14 is formed with plural plasma gas inlets 14C communicating with the plasma gas passage 14B in axial symmetry to the substrate 12 to be processed.

Thus, the plasma gas such as Ar, Kr, Xe, $H_2$, and the like, supplied to the plasma gas supply port 14A, are supplied to the inlets 14C via the plasma gas passage 14B and is released from the inlets 14C to a space 11A right underneath the cover plate 17 inside the processing vessel 11.

On the processing vessel 11, there is further provided, over the cover plate 17, a radial line slot antenna 30 having a radiation plane shown in FIG. 2B with a separation of 4-5 mm from the cover plate 17.

The radial line slot antenna 30 is seated upon the ring-shaped member 14 via a seal ring 16B and is connected to an external microwave source (not shown) via a coaxial waveguide 21. Thereby, the radial line slot antenna excites the plasma gas released to the space 11A by the microwave from the microwave source.

The radial line slot antenna 30 comprises a flat, disk-shaped antenna body 22 connected to an outer waveguide 21A of the coaxial waveguide 21 and a radiation plate 18 formed on an opening of the antenna body 22 and formed with a large number of slots 18a and slots 18b perpendicular thereto as showing in FIG. 2B, wherein a phase retardation plate 19 of a dielectric plate of constant thickness is inserted between the antenna body 22 and the radiation plate 18. Further, a central conductor 21B of the coaxial waveguide 21 is connected to the radiation plate 18, and a cooling block 20 including a coolant passage 20A is provided on the antenna body 22.

With the radial line slot antenna 20 of such a construction, the microwave fed from the coaxial waveguide 21 spreads as it is propagated in the radial direction between the disk-shaped antenna body 22 and the radiation plate 18 and thereby experiences wavelength compression as a result of the action of the phase retardation plate 19. Thus, by forming the slots 18a and 18b in a concentric manner in correspondence to the wavelength of the microwave propagating in the radial direction, it becomes possible to radiate a plane wave of circular polarization in a direction substantially perpendicular to the radiation plate 18.

By using such a radial line slot antenna 30, there is formed uniform high-density plasma in the space 11A right underneath the cover plate 17. Because the high-density plasma thus formed is characterized by low electron temperature, and because of this, there is caused little damages in the substrate 12 to be processed. Further, there is caused no metal contamination originating from the sputtering of the chamber wall of the processing vessel 11.

With the plasma processing apparatus 100 of FIGS. 2A and 2B, there is formed a conductive structure 24 inside the processing vessel 11 between the cover plate 17 and the substrate 12 to be processed such that the conductive structure is formed with a large number of nozzles 24B that release a processing gas supplied from an external processing gas source (not shown) via the processing gas passages 23 and 24A formed in the processing vessel 11, where each of the nozzles 24B releases the processing gas thus supplied to a space 11B between the conductive structure 24 and the substrate 12 to be processed. Thus, the conductive structure 24 functions as a processing gas supplying part. Thereby, it should be noted that the conductive structure 24 constituting the processing gas supplying part is formed with openings 24C between adjacent nozzles 24B and 24B as shown in FIG. 3 with a size that allows efficient passage of the plasma formed in the space 11A to the space 11B by way of diffusion.

Figure 3:
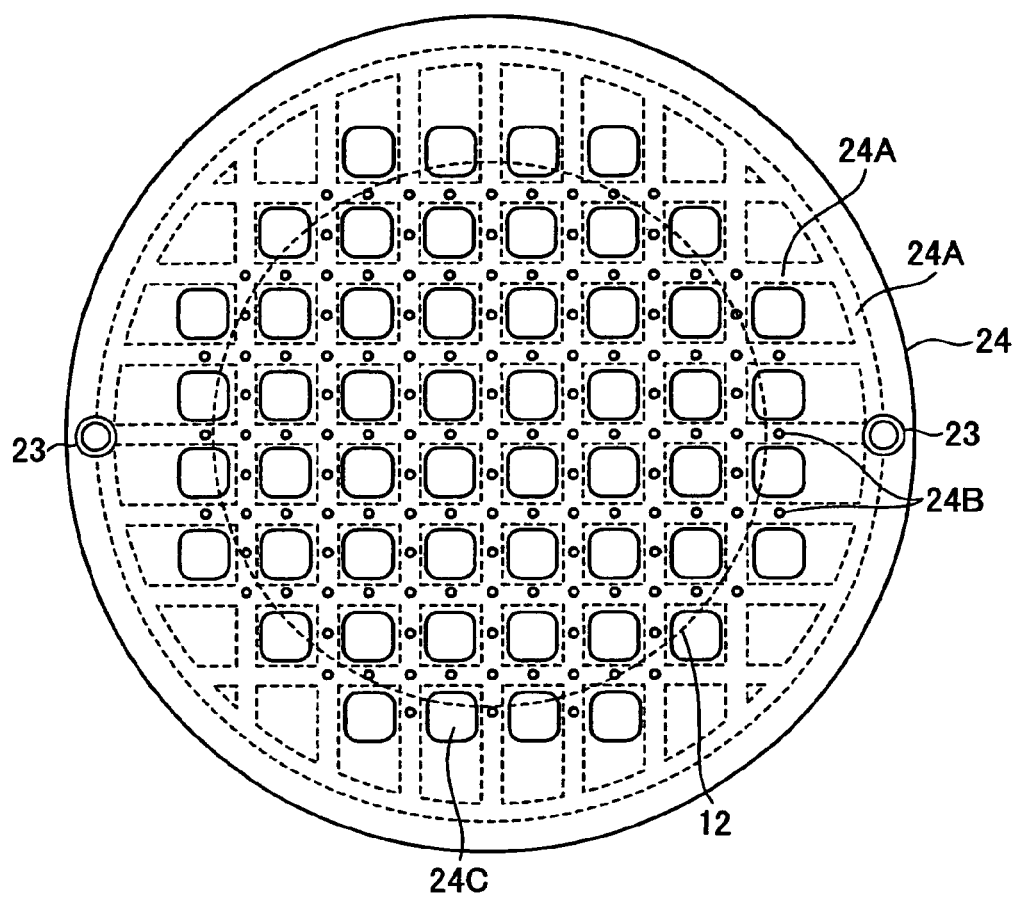
FIG. 3 is a diagram showing a part of the microwave plasma processing apparatus of FIG. 2.

FIG. 3 shows the processing gas supplying part 24 in a bottom view.

As can be seen from FIG. 3, the nozzles 24B are formed at the side of the processing gas supplying part 24 facing the substrate 12, not in the side that faces the cover plate 17.

Thus, the processing gas released from the processing gas supplying part 24 to the space 11B in the plasma processing apparatus 100 of FIGS. 2A and 2B via the nozzles 24B is excited by the high density plasma formed in the space 11A, and a uniform plasma processing is conducted on the substrate 12 to be processed efficiently at high speed, without damaging the substrate and the device structure on the substrate, and without contaminating the substrate. On the other hand, the microwave radiated from the radial line slot antenna 30 is blocked by the processing gas supplying part 24 of a conductive body and there occurs no damaging of the substrate 12 to be processed by the microwave thus emitted from the radial line slot antenna 30.

With the substrate processing apparatus of FIGS. 2A and 2B, the spaces 11A and 11B constitutes the processing space, wherein, in the case the processing gas supplying part 24 of FIG. 3 is provided, excitation of plasma occurs primarily in the space 11A and film formation by the processing gas takes place primarily in the space 11B.

Figure 4A:
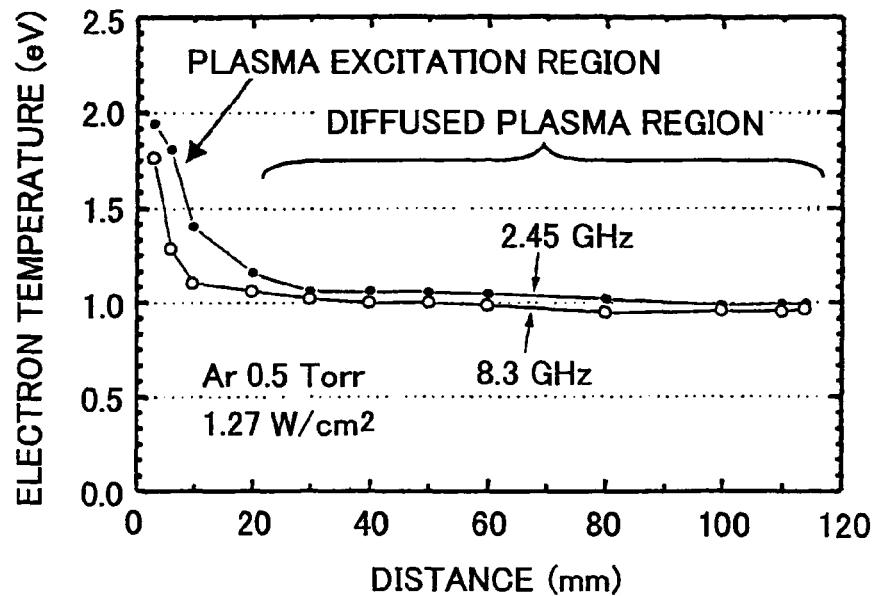
FIG. 4A is a diagram showing an electron temperature distribution in the microwave plasma processing apparatus of FIG. 2.

FIG. 4A shows the distribution of the electron temperature formed in the processing space of the plasma processing apparatus of FIGS. 2A and 2B that includes the space 11A and 11B, for the case the processing pressure in the processing vessel 11 is set to about 67 Pa (0.5 Torr) by introducing an Ar gas from the plasma gas inlet 14C and by feeding a microwave of 2.45 GHz or 8.3 GHz to the radial line slot antenna 30 with the power density of 1.27 W/cm$^2$. In FIG. 4A, it should be noted that the vertical axis represents the electron temperature while the horizontal axis represents the distance as measured from the bottom surface of the cover plate.

Referring to FIG. 4A, the electron temperature becomes maximum in the region immediately underneath the cover plate 17 and takes the value of about 2.0 eV in the case the microwave frequency is 2.45 GHz and the value of about 1.8 eV in the case the microwave frequency is 8.3 GHz, while, in the so-called diffusion plasma region separated from the cover plate 17 by 20 mm or more, it can be seen that the electron temperature is generally constant and takes the value of 1.0-1.1 eV.

Thus, with the microwave plasma processing apparatus 100, it is possible to form the plasma of extremely low electron temperature, and it becomes possible to conduct the process that requires low energy by using such plasma of low electron temperature.

Figure 4B:
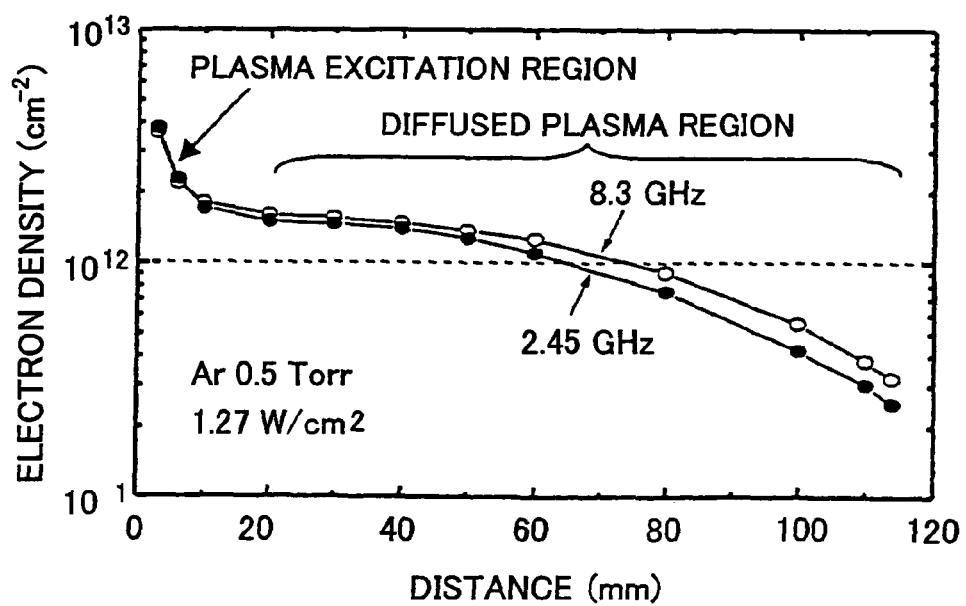
FIG. 4B is a diagram showing an electron density distribution in the microwave plasma processing apparatus of FIG. 2.

FIG. 4B shows the distribution of the plasma electron density caused in the processing vessel 11 in the plasma processing apparatus 100 of FIGS. 2A and 2B.

Referring to FIG. 4B, the illustrated example is the result for the case the processing pressure in the processing vessel 11 is set to about 67 Pa (0.5 Torr) by introducing an Ar gas from the plasma gas inlet 14C and a microwave of 2.45 GHz or 8.3 GHz is fed to the radial line slot antenna 30 with the power density of 1.27 W/cm$^2$, wherein it can be seen that a very high plasma density of $1 \times 10^{12}$ cm$^{-2}$ is realized up to the distance of 60-70 mm from the bottom surface of the cover plate 17 in any of the case in which the frequency is 2.45 GHz and the case in which the frequency is 8.3 GHz.

Thus, with the present embodiment, it is possible to form a F-doped carbon film on the substrate 12 to be processed, by setting the position of the processing gas inlet 24 at the distance within 60 mm from the bottom surface of the cover plate 17 such that the foregoing plasma electron density of $1 \times 10^{12}$ cm$^{-2}$ is realized and further by exciting the plasma in the processing vessel 11A by introducing the Ar gas from the plasma gas inlet 14C and by feeding the microwave of 1-10 GHz from the antenna, and further by introducing a $C_5F_8$ gas to the processing space 11B from the processing gas inlet 24 in this state.

FIGS. 5A-5H are the diagrams showing the fabrication process of a semiconductor device according to a first embodiment of the present invention.

Figure 5A:
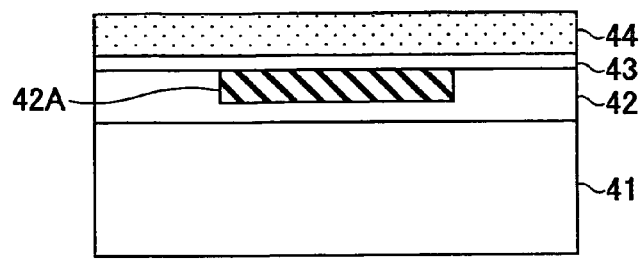
FIG. 5A is a first diagram showing the fabrication process of a semiconductor device according to a first embodiment of the present invention.

Referring to FIG. 5A there is formed a cap layer 43 of an SiN film or SiOC film on the Si substrate 41, on which an insulation film 42 of $SiO_2$, SiOC, or other low-K dielectric film is formed, and a F-doped carbon film 44 is formed on the cap layer 43 in the plasma processing apparatus 100 explained with reference to FIGS. 2A and 2B by introducing a $C_5F_8$ source gas to the processing space 11B from the processing gas supplying part 24. Such deposition of the F-doped carbon film 44 can be conducted by setting the substrate temperature to 250° C. and by supplying an Ar gas to the space 11A right underneath the cover plate 17 from the plasma gas supplying part 14C under the pressure of about 100 Pa and further by supplying the microwave of the frequency of 2.45 GHz from the radial line slot antenna 30 with the power density of 2.0 W/cm$^2$. In the illustrated example, an interconnection pattern 42A of Cu, or the like, is embedded in the low-K insulation film 42.

In the case of forming a F-doped carbon film 44 by a plasma CVD process that uses an ordinary plasma processing apparatus of parallel plate type (CCP type) or ICP type, there is a need of adding a hydrogen gas for removing the F radicals formed as a result of dissociation of the source gas molecules from the system, and thus, it is inevitable that the obtained F-doped carbon film contains a large amount of hydrogen. Contrary to this, in the case of causing dissociation of fluorocarbon source having the F/C ratio, defined as the ratio of the number of F atoms to the number of C atoms in a molecule, is larger than 1 but less than 2, such as the C5F8 source gas, in the plasma processing apparatus of FIGS. 2A and 2B by the microwave supplied from the radial line slot antenna 30, it is possible to form a desired F-doped carbon film 44 without adding a hydrogen gas. Thus, the F-doped carbon film 44 formed in such a manner is a film substantially free from hydrogen.

Figure 5B:
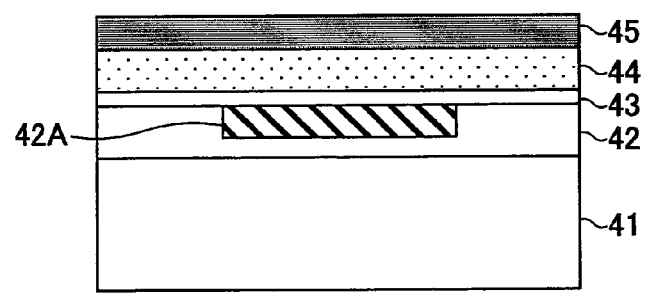
FIG. 5B is a second diagram showing the fabrication process of a semiconductor device according to a first embodiment of the present invention.

After forming the F-doped carbon film 44 in this way, the step of FIG. 5B is conducted next, in which a hard mask film 45 of SiCN, SiN or $SiO_2$ is formed on the F-doped carbon film 44 by using the same plasma processing apparatus 100. Further, in the step of FIG. 5C, a resist pattern 46 having an opening 46A is formed on the hard mask film 45 by an ordinary photolithographic process. In the case of forming the hard mask film 45 by an SiCN film in the plasma processing apparatus 100, trimethyl silane is supplied from the processing gas supplying part 24 to the processing space 11B as a source gas, and plasma containing nitrogen radicals is excited by supplying an Ar gas and a nitrogen gas to the space 11A right underneath the cover plate 17 from the plasma gas supplying part 14C. In a typical example, deposition of such an SiCN film 45 can be conducted by setting the substrate temperature to 350° C. and supplying the microwave of the 2.54 GHz frequency from the radial line slot antenna 30 under the pressure of about 200 Pa with the power density of 1.0 $W/cm^2$.

Figure 5C:
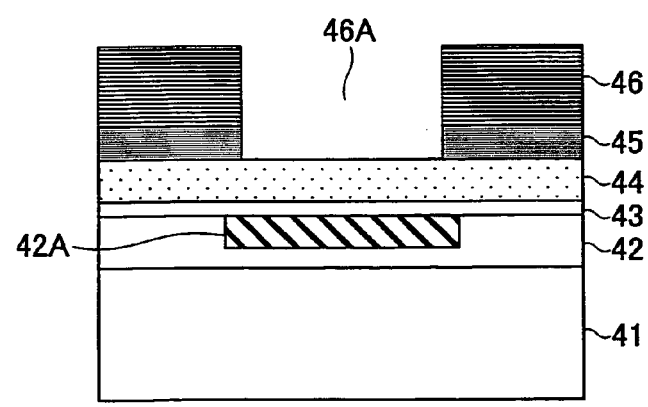
FIG. 5C is a third diagram showing the fabrication process of a semiconductor device according to a first embodiment of the present invention.
Figure 5D:
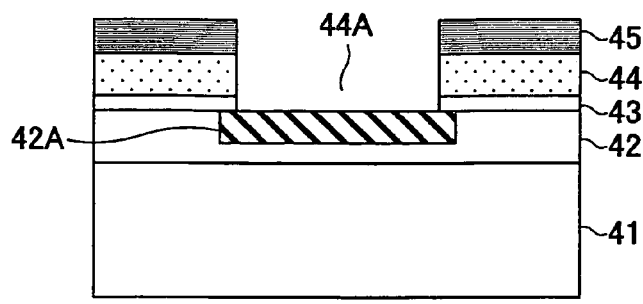
FIG. 5D is a fourth diagram showing the fabrication process of a semiconductor device according to a first embodiment of the present invention.

Further, in the step of FIG. 5C, a hard mask pattern 45A is formed by patterning the hard mask layer 45 while using the resist pattern 46 as a mask, and in the step of FIG. 5D, the F-doped carbon film 44 underneath the hard mask pattern 45 is patterned while using the hard mask pattern 45A as a mask. As a result, there is formed an opening corresponding to the resist opening 46A in the F-doped carbon film 44 such that the interconnection layer 42A is exposed at the bottom of the opening 44A.

Figure 5E:
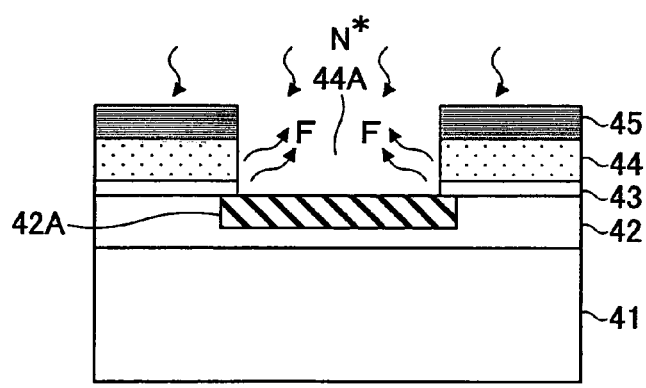
FIG. 5E is a fifth diagram showing the fabrication process of a semiconductor device according to a first embodiment of the present invention.

With the present embodiment, the structure of FIG. 5D is introduced again into the plasma processing apparatus 100 of FIGS. 2A and 2B in the step of FIG. 5E, and nitrogen radicals N* are formed by introducing a mixed gas of Ar and nitrogen into the space 11A right underneath the cover plate 17 from the plasma gas inlet 14C.

With the step of FIG. 5E, the nitrogen radicals N* thus formed are used to process the substrate 41 in the processing space 11B, such that there is caused decoupling of the F atoms existing on the surface of the F-doped carbon film 44 exposed at the sidewall surface of the opening 44A. Further, as a result of such nitrogen radical processing, there is a possibility that a modified layer is formed on the exposed surface of the F-doped carbon film 44 by coupling of nitrogen.

Figure 5F:
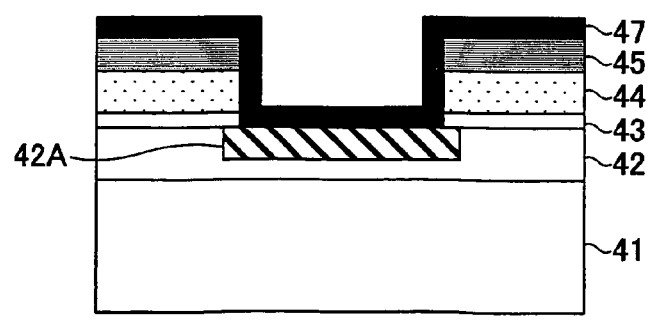
FIG. 5F is a sixth diagram showing the fabrication process of a semiconductor device according to a first embodiment of the present invention.

After the step of FIG. 5E, a Ta film 47 is formed on the structure of FIG. 5E in the step of FIG. 5F with the present embodiment as a barrier metal film, such that the Ta film 47 covers the surface of the hard mask film 45 and the exposed sidewall surface of the F-doped carbon film 44 and the surface of the interconnection pattern exposed at the bottom of the opening 44A continuously.

Because the F atoms are removed from the surface of the F-doped carbon film 44 exposed at the sidewall surface of the opening 44A in the step of FIG. 5E with the present embodiment, there occurs no substantial formation of volatile TaF even in the case the Ta film 47 is formed so as to cover the sidewall surface, and the Ta film 47 has excellent adherence. Further, because the F-doped carbon film is substantially free from hydrogen, release of HF from the film 44 is suppressed also effectively.

Meanwhile, in the case the conventional F-doped carbon film is processed by the nitrogen radicals as in the step of FIG. 5E, it is common that there occurs severe etching, and it is extremely difficult to conduct a modification process, while there is a possibility that this problem is caused by the reaction of the hydrogen contained in the F-doped carbon film with the nitrogen radical to form an N—H group. Contrary to this, the F-doped carbon film of the present invention is film substantially free from hydrogen, and no such a problem takes place.

Figure 5G:
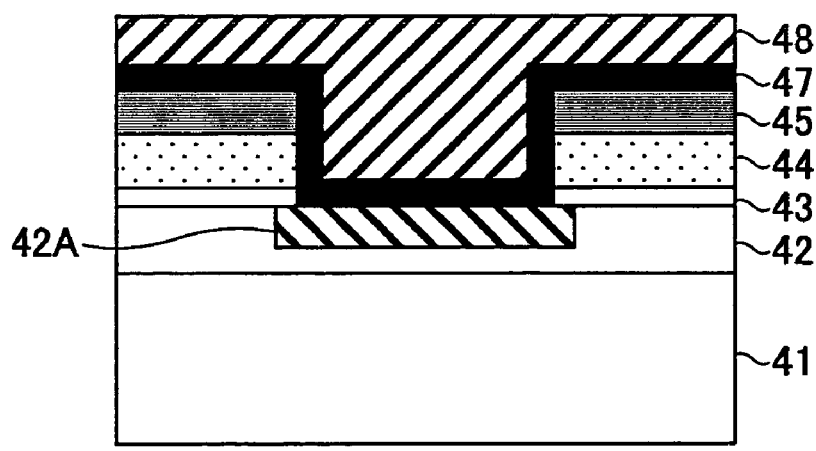
FIG. 5G is a seventh diagram showing the fabrication process of a semiconductor device according to a first embodiment of the present invention.
Figure 5H:
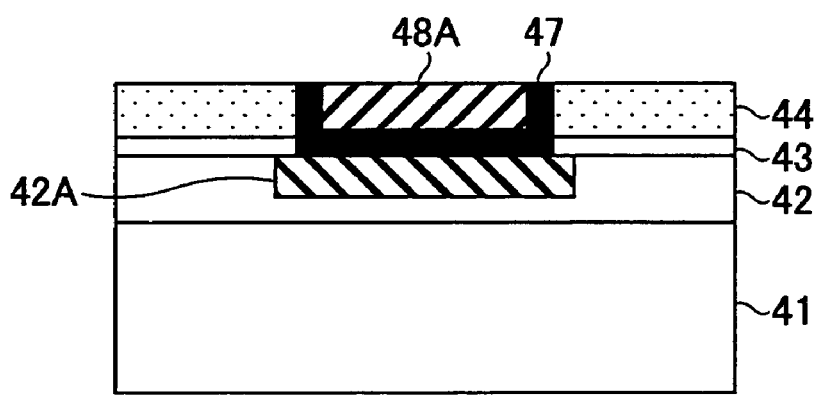
FIG. 5H is an eighth diagram showing the fabrication process of a semiconductor device according to a first embodiment of the present invention.

After the step of FIG. 5F, a Cu layer 48 is formed on the structure of FIG. 5D in the step of FIG. 5G typically by a seed layer forming process conducted by a CVD process and an electrolytic plating process so as to film the opening 44A. Further, in the step of FIG. 5H, a part of the Cu layer 48 including the barrier metal film 47 and the hardmask film 45 is removed, and a structure is obtained such that a Cu pattern 48A constituting a Cu interconnection pattern or plug is formed in the F-doped carbon film 44 via a Ta barrier metal film 47.

As explained before, the structure thus obtained is stable and highly reliable contact is realized.

Second Embodiment

In the first embodiment of the present invention explained before, there is a need of conducting a cleaning process after the dry etching process of FIG. 5D for removing impurities deposited on the sidewall surface of the opening 44A, and thus, the cleaning process has been conducted by taking out the structure from the dry etching apparatus.

However, in the case the cleaning process of the structure of FIG. 5D is conducted in the air, water vapor in the air is adsorbed upon the sidewall surface of the opening 44A, and there is a possibility that formation of HF is caused.

Figure 6:
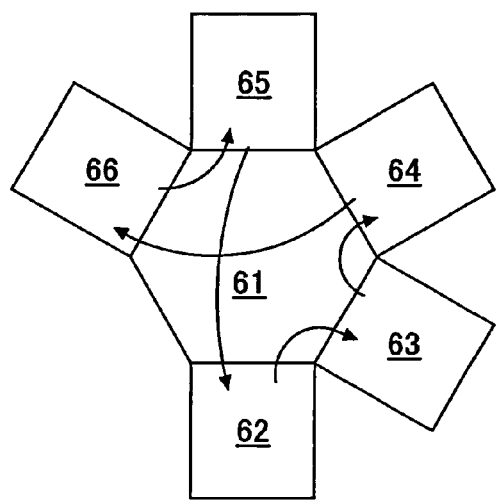
FIG. 6 is a diagram showing the construction of a cluster-type substrate processing apparatus according to a second embodiment of the present invention.

Thus, with the present embodiment, all the process steps from FIG. 5D to FIG. 5F are conducted by using a cluster-type substrate processing system 60 shown in FIG. 6.

Referring to FIG. 6, the cluster-type substrate processing apparatus 60 comprises a vacuum transfer chamber 61 coupled with a load-lock chamber 62 for loading in and out a substrate and provided with a transfer robot therein, a dry etching chamber 63 coupled to the vacuum transfer chamber 61, a modification processing chamber 64 coupled to the vacuum transfer chamber 61 and conducing modification processing of FIG. 5E, a sputtering chamber 65 coupled to the vacuum transfer chamber 61 and conducting deposition of Ta film of FIG. 5F, and a cleaning chamber 66 coupled to the vacuum transfer chamber 61 and conducting dry cleaning to the structure of FIG. 5D, wherein each of the dry etching chamber 63 and the modification chamber 64 is provided with a plasma processing apparatus 100 of the construction identical to the one explained with reference to FIGS. 2A and 2B.

Thus, after the step of FIG. 5C, the substrate 41 is introduced, after removing the resist pattern 46 by an ashing process, or the like, from the load-lock chamber 62 to the dry etching chamber 63 via the vacuum transfer chamber 61, and the dry etching process of FIG. 5D is conducted.

With this dry etching process, an Ar gas is introduced into the space 11A from the plasma gas inlet 14C and an etching gas such as $N_2+H_2$ is introduced into the processing space 11B from the processing part 24 in the plasma processing apparatus 100 provided in the dry etching chamber 63, and the desired dry etching is conducted by introducing a microwave to the space 11A from the radial line slot antenna 30 via the microwave window 17 while applying a high frequency bias to the stage 13 from the high frequency source 13A.

After the dry etching process of FIG. 5D, the substrate 41 under processing is transported to the modification chamber 64 via the vacuum transfer chamber 61, and the modification processing of FIG. 5E is conducted.

With this modification processing, an Ar gas and a nitrogen gas are introduced into the space 11A from the plasma gas inlet 14C with the plasma processing apparatus 100 provided in the modification chamber 64, and the modification processing of FIG. 5E is conducted by introducing a microwave to the space 11A via the microwave window 17 from the radical line slot antenna 30.

Further, after the modification processing of FIG. 5E, the substrate 41 under processing is transferred to the dry cleaning chamber 66 via the vacuum transfer chamber 61, and a dry cleaning processing is conducted by using $NF_3$, $F_2$, $CO_2$ or a chlorofluorocarbon family gas.

The substrate 41 thus completed with the dry cleaning processing in the processing chamber 66 is further forwarded to the sputtering processing chamber 65 via the vacuum transfer chamber 61, and the Ta barrier metal film 47 is formed by the process of FIG. 5F.

After the step of FIG. 5F, the substrate 41 under processing is returned to the load-lock chamber 62 via the vacuum transfer chamber 61.

Figure 7:
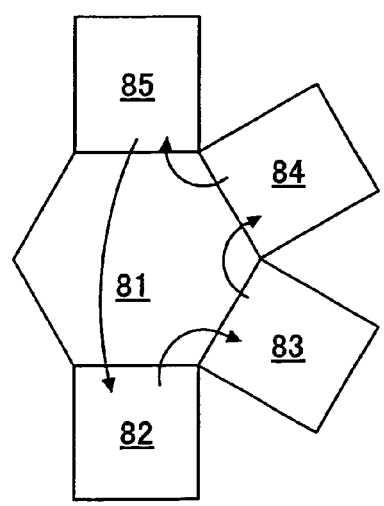
FIG. 7 is a diagram showing the construction of another cluster-type substrate processing apparatus used with the second embodiment of the present invention.

FIG. 7 shows the construction of another cluster-type substrate processing system 80 that is used together with the substrate processing system 60 of FIG. 6 for formation of the cap film 43, the F-doped carbon film 44 and the hard mask film 45.

Referring to FIG. 7, the cluster-type substrate processing apparatus 80 comprises a vacuum transfer chamber 81 coupled with a load-lock chamber 82 for loading in and out a substrate and provided with a transfer robot therein, a deposition chamber 83 coupled to the vacuum transfer chamber 81 and used for the formation of the cap film 43, a deposition chamber 84 coupled to the vacuum transfer chamber 81 and used for the formation of the F-doped carbon film 44, and a deposition chamber 85 coupled to the vacuum transfer chamber 81 and used for formation of the hard mask film 45, wherein each of the deposition chambers 83, 84 and 85 is provided with the plasma processing apparatus 100 identical in construction with that explained with reference to FIGS. 2A and 2B.

Thus, after formation of the insulation film 42 and the interconnection pattern 42A, the substrate 41 under processing is transported to the deposition chamber from the load-lock chamber 82 via the vacuum transfer chamber 81, the cap film 43 is formed on the insulation film 42 by supplying an Ar gas and a nitrogen to the space 11A right underneath the cover plate 17 from the plasma gas supplying part 14C and by supplying a Si-containing gas such as trimethyl-silane or SiH4 to the processing space 11B from the processing gas supplying part 24 in the plasma processing apparatus 100 provided in the processing chamber 83, and further by exciting microwave plasma by feeding a microwave to the space 11A from the radial line slot antenna 30 via the cover plate 17.

After formation of the cap layer 43, the substrate 41 under processing is transferred to the deposition chamber 84 from the deposition chamber 83 via the vacuum transfer chamber 81, and in the plasma processing apparatus 100 in the deposition chamber 84, an Ar gas and a nitrogen gas are supplied from the plasma gas supplying part 14C to the space 11A right underneath the cover plate 17, and the F-doped carbon film 44 is formed on the cap layer 43 by supplying a fluorocarbon source gas having the F/C ratio in the molecule larger than 1 but less than 2, such as $C_5F_8$, into the processing space 11B from the processing gas supplying part 24, and further by exciting microwave plasma in the space 11A by supplying a microwave in the space 11A from the radial line slot antenna 30 via the cover plate 17. As explained previously, it is not necessary to add a hydrogen gas to the source gas in the formation step of the F-doped carbon film, and thus, the obtained F-doped carbon film 44 is substantially free from hydrogen.

After such formation of the F-doped carbon film, the substrate 41 under processing is transported to the deposition chamber 85 from the deposition chamber 84 via the vacuum transfer chamber 81, and the hard mask film 45 is formed on the F-doped carbon film in the plasma processing apparatus 100 in the deposition chamber 85 by supplying an Ar gas and a nitrogen gas to the space 11A right underneath the cover plate 17 from the plasma gas supplying part 14C and by supplying a Si-containing source gas such as trimethyl silane or SiH4 to the processing space 11B from the processing gas supplying part 24, and further exciting microwave plasma in the space 11A by supplying a microwave to the space 11A from the radial line slot antenna via the cover plate 17.

The substrate 41 thus formed with the hard mask film 45 is returned to the load-lock chamber via the vacuum transfer chamber 81 and is forwarded to the resist process and photo-lithographic process of FIG. 5C.

Thus, by using the cluster-type substrate processing system 80 of FIG. 7, it becomes possible to form the hard mask film 45 on the F-doped carbon film 44 without exposing the F-doped carbon film 44 to the air, and it becomes possible to avoid water adsorption to the surface of the film 44.

Third Embodiment

Figure 8:
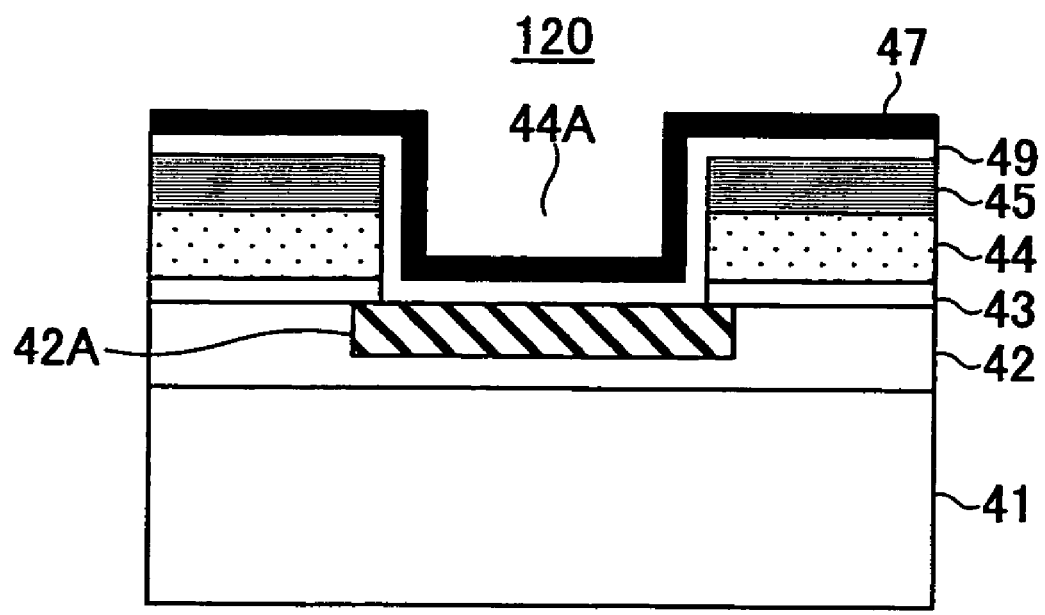
FIG. 8 is a diagram showing the construction of the semiconductor device according to a third embodiment of the present invention.

FIG. 8 is a diagram showing the construction of a semiconductor device 120 according to a third embodiment of the present invention, wherein those parts of FIG. 8 explained previously are designated by the same reference numerals and the description thereof will be omitted.

Referring to FIG. 8, the illustrate shows the state after the Ta barrier metal film 47 is formed but before the Cu layer 48 of FIG. 5G is formed explained previously with reference to FIG. 5F, wherein it should be noted that, with the present embodiment, an Al film 49 is deposited between the surface of the hard mask film 45 or the F-doped carbon film exposed at the opening 44A and the Ta barrier metal film 47.

By providing the Al film 49, the Ta barrier film 47 is separated from the F-doped carbon film 44 and the problem of formation of volatile TaF as a result of reaction of the barrier film 47 with F is avoided. Because Al forms stable AlF when reacted with F, it can be seen that there is formed an AlF layer in the construction of FIG. 8 in the part of the Al film 49 that forms an interface contacting with the F-doped carbon film surface. Further, there is formed an Al—Cu alloy in the part of the Al film 49 that corresponds to the bottom of the opening 44A where contact to the Cu interconnection pattern 42A is to be made.

The Al film 49 is typically formed by a sputtering process, while it is also possible to form by an ALD process or CVD process.

For the film 49, any metal film that forms a stable compound when reacted with F can be used. For example, it is possible to use Ru, Ni, Co, Pt, Au, Ag, or the like, in addition to Al.

With the present embodiment, too, it is preferable to form the F-doped carbon film 33 by using the fluorocarbon source in which the F/C ratio is larger than 1 but smaller than 2 for avoiding the formation of corrosive HF and by using the microwave plasma processing apparatus 100 explained with reference to FIGS. 2A and 2B.

Thereby, it is also possible to use $C_3F_4$, $C_4F_6$, or the like, in addition to $C_5F_8$, for the fluorocarbon source.

Further, modification of the fluorine-doped carbon film of the present invention is not limited to nitrogen or Ar explained before, but it is also possible to conduct by using in the radicals containing any of Kr, C, B and Si.

While the present invention has been explained heretofore with reference to preferred embodiments, the present invention is by no means limited to such specific embodiments, and various variations and modifications can be made within the scope of the invention in patent claims.

INDUSTRIAL APPLICABILITY

The present invention is generally applicable to the method of forming an insulation film and is applicable particularly to the film forming method of a F (fluorine)-doped carbon film, the fabrication method of a semiconductor device that uses such a forming method of fluorine-doped carbon film, a semiconductor device fabricated with such a method, and further to a substrate processing system for fabrication of such a semiconductor device.

The invention claimed is:

1. A film forming method, comprising the steps of:
   forming a F-doped carbon film by using a source gas containing C and F; and
   after the forming the F-doped carbon film, modifying a chemical composition of said F-doped carbon film with radicals consisting of Ar and nitrogen, wherein
   said source gas has a F/C ratio larger than 1 and smaller than 2, the F/C ratio being defined as a ratio of a number of F atoms to a number of C atoms in a source gas molecule.

2. The film forming method as claimed in claim 1, wherein said modifying step removes F atoms the terminate an exposed surface of said F-doped carbon film.

3. The film forming method as claimed in claim 1, wherein said radicals are excited by a microwave plasma.

4. The film forming method as claimed in claim 3, wherein said microwave plasma is formed by introducing a microwave into a processing space in which said F-doped carbon film is formed by a planar microwave antenna via a microwave window that forms said processing space.

5. The film forming method as claimed in claim 1, wherein said source gas includes any of $C_3F_4$, $C_4F_6$ and $C_5F_8$.

6. The film forming method as claimed in claim 1, wherein said source gas is free from a hydrogen gas component.

7. The film forming method as claimed in claim 1, wherein said F-doped carbon film is formed by a plasma CVD process that uses the source gas containing C and F.

8. The film forming method as claimed in claim 7, wherein said plasma CVD process is conducted by dissociating said source gas by a microwave plasma.

9. The film forming method as claimed in claim 1, wherein said modifying step modifies said F-doped carbon film by a coupling of nitrogen atoms to said film.

10. A method of fabricating a semiconductor device, comprising the steps of:
    depositing a F-doped carbon film on a substrate by a plasma CVD process that uses a source gas that contains C and F in a molecule thereof;
    forming an opening in said F-doped carbon film by a dry etching process of said F-doped carbon film; and
    covering a sidewall surface and a bottom surface of said opening by a metal film, wherein
    there is provided, after said step of forming said opening but before said step of covering said sidewall surface and bottom surface of said opening by said metal film, a step of modifying a chemical composition of at least said sidewall surface of said opening with radicals consisting of Ar and nitrogen, said source gas having a F/C ratio larger than 1 and smaller than 2, the F/C ratio being defined as a ratio of a number of F atoms to a number of C atoms in said source gas molecule.

11. The method for fabricating a semiconductor device as claimed in claim 10, wherein said radicals in said modifying step are excited by a microwave plasma.

12. The method for fabricating a semiconductor device as claimed in claim 10, wherein said step of depositing said F-doped carbon film further comprises a step of forming a hard mask film on a surface of said F-doped carbon film,
    said step of depositing said F-doped carbon film and said step of forming said hard mask film are conducted respectively in first and second processing chambers coupled to a first vacuum transfer chamber, and
    said step of forming said opening and said step modifying step are conducted respectively in third and fourth processing chambers coupled to a second vacuum transfer chamber.

13. The method for fabricating a semiconductor device as claimed in claim 10, wherein said modifying step modifies said F-doped carbon film by a coupling of nitrogen atoms to said film.

* * * * *